(12) United States Patent
Kobayashi et al.

(10) Patent No.: US 10,840,122 B2
(45) Date of Patent: Nov. 17, 2020

(54) TEACHING METHOD OF TRANSFER DEVICE

(71) Applicant: Tokyo Electron Limited, Tokyo (JP)

(72) Inventors: Toshiyuki Kobayashi, Miyagi (JP); Ryu Kitahara, Miyagi (JP); Kazuya Koshiishi, Yamanashi (JP); Junya Sato, Miyagi (JP); Shun Suto, Miyagi (JP); Toshimitsu Chiba, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 166 days.

(21) Appl. No.: 16/210,364

(22) Filed: Dec. 5, 2018

(65) Prior Publication Data

US 2019/0181031 A1 Jun. 13, 2019

(30) Foreign Application Priority Data

Dec. 12, 2017 (JP) ................. 2017-237901

(51) Int. Cl.
| | |
|---|---|
| *H01L 21/683* | (2006.01) |
| *H01L 21/687* | (2006.01) |
| *B25J 9/16* | (2006.01) |
| *H01L 21/677* | (2006.01) |
| *H01L 21/67* | (2006.01) |

(Continued)

(52) U.S. Cl.
CPC ...... *H01L 21/6838* (2013.01); *H01L 21/6773* (2013.01); *H01L 21/67167* (2013.01); *H01L 21/67253* (2013.01); *H01L 21/67265* (2013.01); *H01L 21/67772* (2013.01); *H01L 21/68707* (2013.01); *B25J 9/163* (2013.01); *B65G 49/07* (2013.01); *H01L 21/681* (2013.01)

(58) Field of Classification Search
CPC .................................................. H01L 21/6838
See application file for complete search history.

(56) References Cited

U.S. PATENT DOCUMENTS

| | | | | |
|---|---|---|---|---|
| 6,454,332 B1 * | 9/2002 | Govzman | ............ | H01L 21/681 |
| | | | | 294/103.1 |
| 2002/0050322 A1 * | 5/2002 | Kunisawa | ........... | H01L 21/6838 |
| | | | | 156/345.11 |

(Continued)

FOREIGN PATENT DOCUMENTS

JP 2002-313872 10/2002

*Primary Examiner* — Thomas Randazzo
(74) *Attorney, Agent, or Firm* — IPUSA, PLLC

(57) ABSTRACT

A teaching method according to an embodiment is for a transfer device including a substrate holding unit including a suction port for holding a substrate by applying suction, an actuation mechanism for moving the substrate holding unit, and a pressure detecting unit for detecting a pressure in a suction path communicating with the suction port. The method includes: moving the substrate holding unit under the substrate; moving the substrate holding unit upward toward the substrate, while applying suction to the suction path and detecting the pressure in the suction path; determining whether or not the substrate holding unit has touched the substrate, based on the pressure in the suction path; and storing, as a standard position, a position of the substrate holding unit at a time of determining that the substrate holding unit has touched the substrate.

12 Claims, 9 Drawing Sheets

(51) Int. Cl.
*B65G 49/07* (2006.01)
*H01L 21/68* (2006.01)

(56) References Cited

U.S. PATENT DOCUMENTS

| | | | |
|---|---|---|---|
| 2007/0297878 A1* | 12/2007 | Masutani | H01L 21/6838 414/222.02 |
| 2008/0107509 A1* | 5/2008 | Whitcomb | H01L 21/68707 414/225.01 |
| 2009/0087932 A1* | 4/2009 | Kondoh | H01L 21/67248 438/30 |
| 2014/0023776 A1* | 1/2014 | Kuwahara | B05C 13/00 427/8 |
| 2014/0199140 A1* | 7/2014 | Matsumoto | H01L 21/67772 414/222.07 |
| 2015/0219439 A1* | 8/2015 | Kondoh | H01L 21/67259 356/614 |
| 2015/0246447 A1* | 9/2015 | Furuichi | H01L 21/6838 294/188 |
| 2016/0020125 A1* | 1/2016 | Kuwahara | H01L 21/67778 414/222.02 |
| 2017/0170050 A1* | 6/2017 | Yoshida | H01L 21/67253 |
| 2018/0019153 A1* | 1/2018 | Matsunaga | H01L 21/6838 |

\* cited by examiner

TEACHING METHOD OF TRANSFER DEVICE

CROSS-REFERENCE TO RELATED APPLICATIONS

This patent application is based on and claims priority to Japanese Patent Application No. 2017-237901 filed on Dec. 12, 2017, the entire contents of which are incorporated herein by reference.

BACKGROUND OF THE INVENTION

1. Field of the Invention

The present invention generally relates to a teaching method of a transfer device.

2. Description of the Related Art

In manufacturing a semiconductor device, a substrate processing system equipped with a transfer device for transferring a substrate between modules is used. In the substrate processing system, the transfer device loads a substrate into each module, and places the substrate on a stage provided in each module.

In such a substrate processing system, in order to transfer a substrate precisely to each module, information necessary for transferring a substrate, such as a position in each module in which a substrate is to be placed, is stored (taught) in advance (this operation may be referred to as "teaching") (see Patent Document 1, for example).

In general, teaching for placing a substrate at a central position of a stage (may be referred to as "horizontal direction teaching") is performed by a control device automatically. However, vertical direction teaching has been performed by an operator detecting a position visually and inputting position information to a transfer device by hand. Thus, accuracy of the vertical direction teaching varies depending on skill of the operator.

One aspect of the present invention aims at providing a teaching method of a transfer device capable of reducing variation of accuracy of vertical direction teaching.

CITATION LIST

Patent Document

[Patent Document 1] Japanese Laid-open Patent Application Publication No. 2002-313872

SUMMARY OF THE INVENTION

A teaching method according to an embodiment of the present invention is for a transfer device including a substrate holding unit including a suction port for holding a substrate by applying suction, an actuation mechanism configured to move the substrate holding unit, and a pressure detecting unit configured to detect a pressure in a suction path communicating with the suction port. The method includes a first moving step of moving the substrate holding unit under the substrate; a second moving step of moving the substrate holding unit upward toward the substrate, while applying suction to the suction path and detecting the pressure in the suction path; a determination step of determining whether or not the substrate holding unit has touched the substrate, based on the pressure in the suction path; and a storing step of storing, as a standard position, a position of the substrate holding unit at a time of determining that the substrate holding unit has touched the substrate.

DETAILED DESCRIPTION OF EMBODIMENTS

Embodiments of the present invention will be described in the following. Note that in the following descriptions and the drawings, elements having substantially identical features are given the same reference symbols and overlapping descriptions may be omitted.

[Substrate Processing System]

As an example of a substrate processing system to which a teaching method according to an embodiment is applied, a substrate processing system that performs a single wafer processing and is capable of applying a process, such as depositing, to a semiconductor wafer (hereinafter referred to as a "wafer W") will be described.

Figure 1:
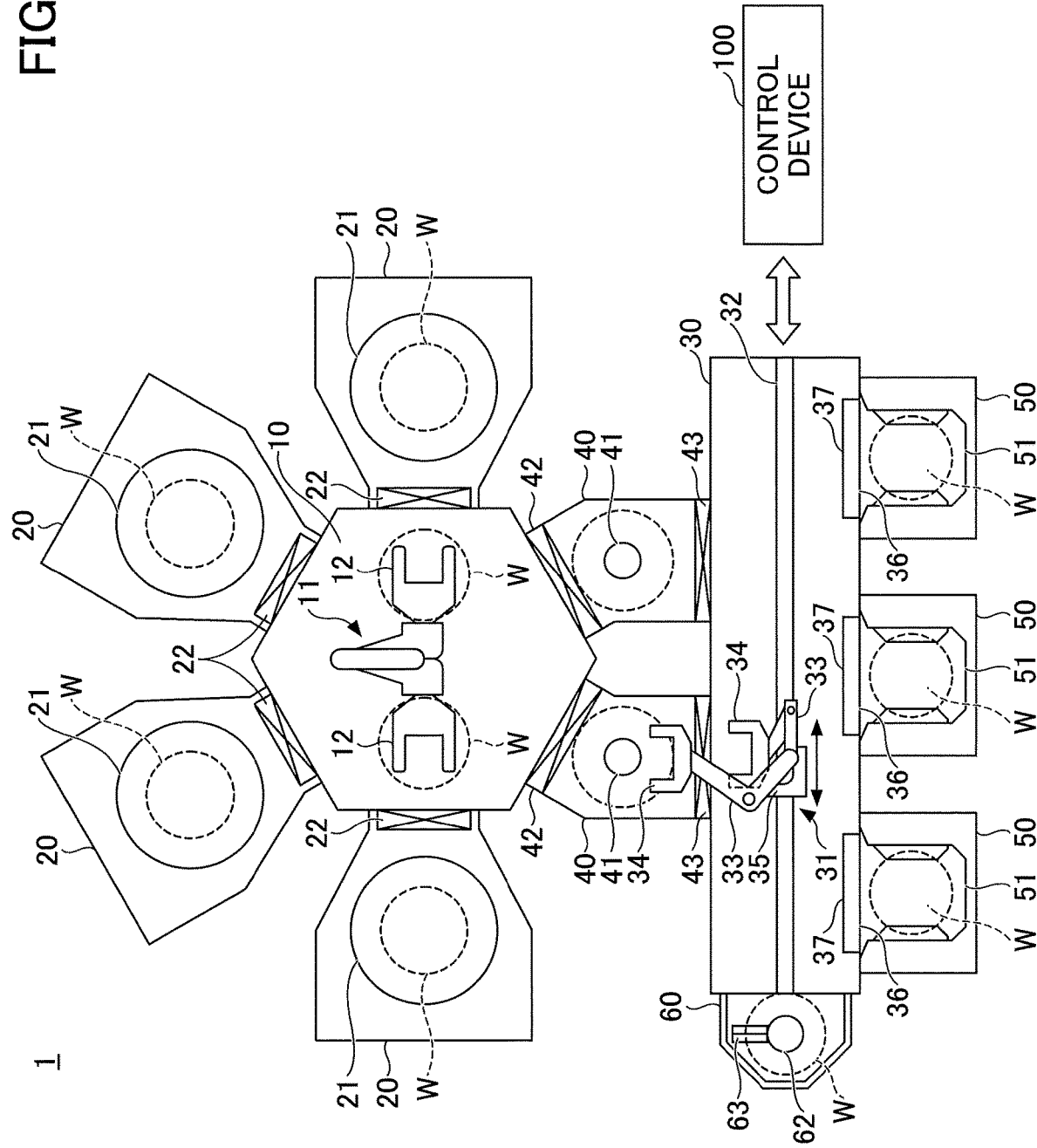
FIG. 1 is a diagram illustrating a schematic configuration of a substrate processing system according to an embodiment.
Figure 2:
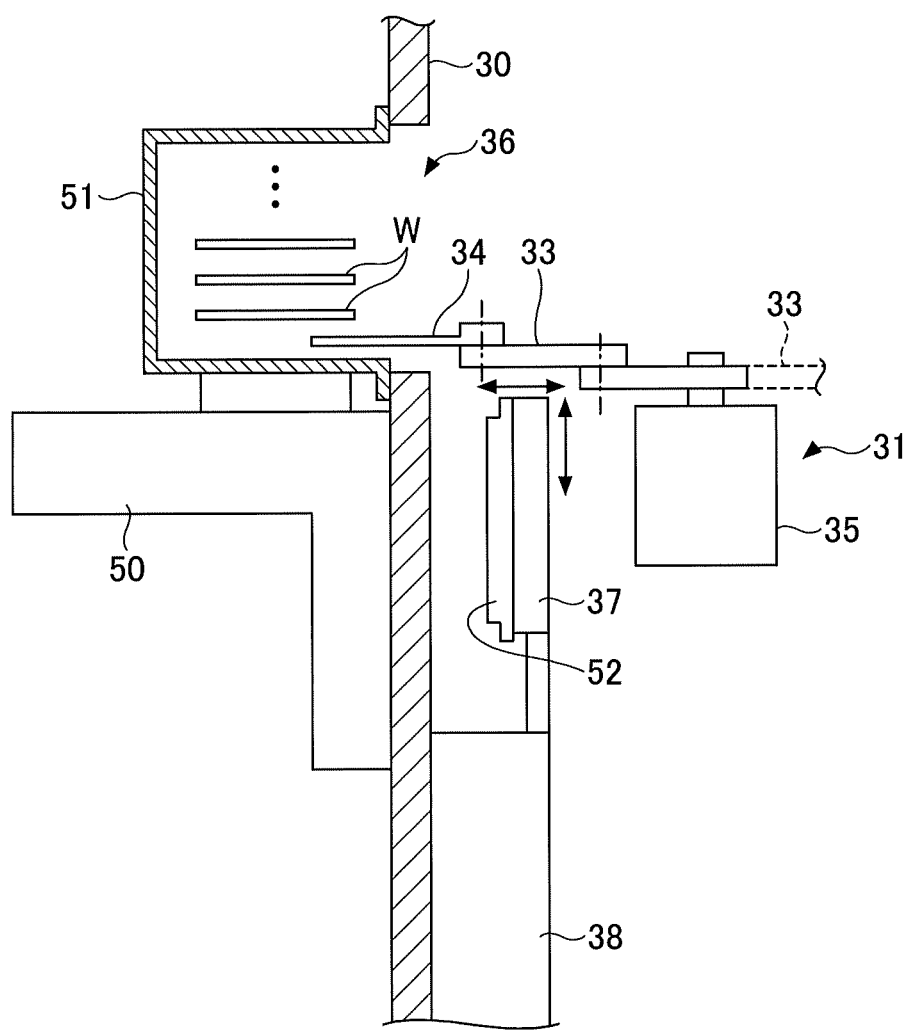
FIG. 2 is a diagram illustrating an example of a cross section of a load port.
Figure 3:
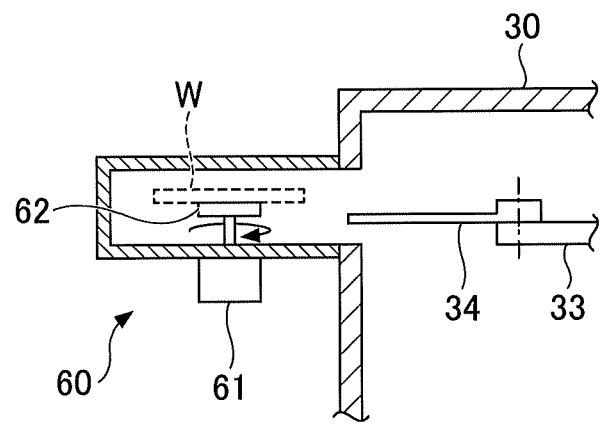
FIG. 3 is a diagram illustrating an example of a cross section of an orienter.
Figure 4:
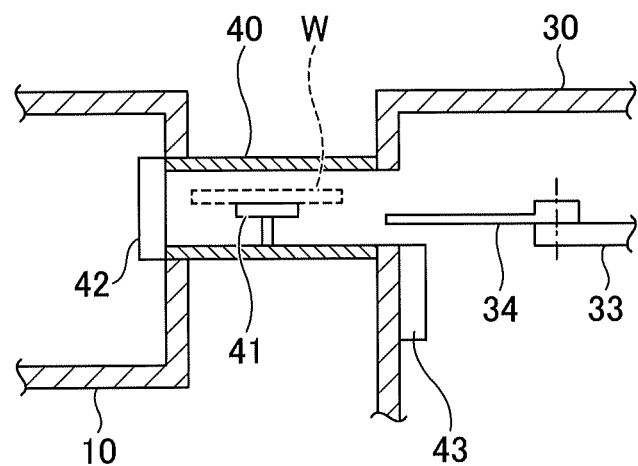
FIG. 4 is a diagram illustrating an example of a cross section of a load-lock module.
Figure 5:
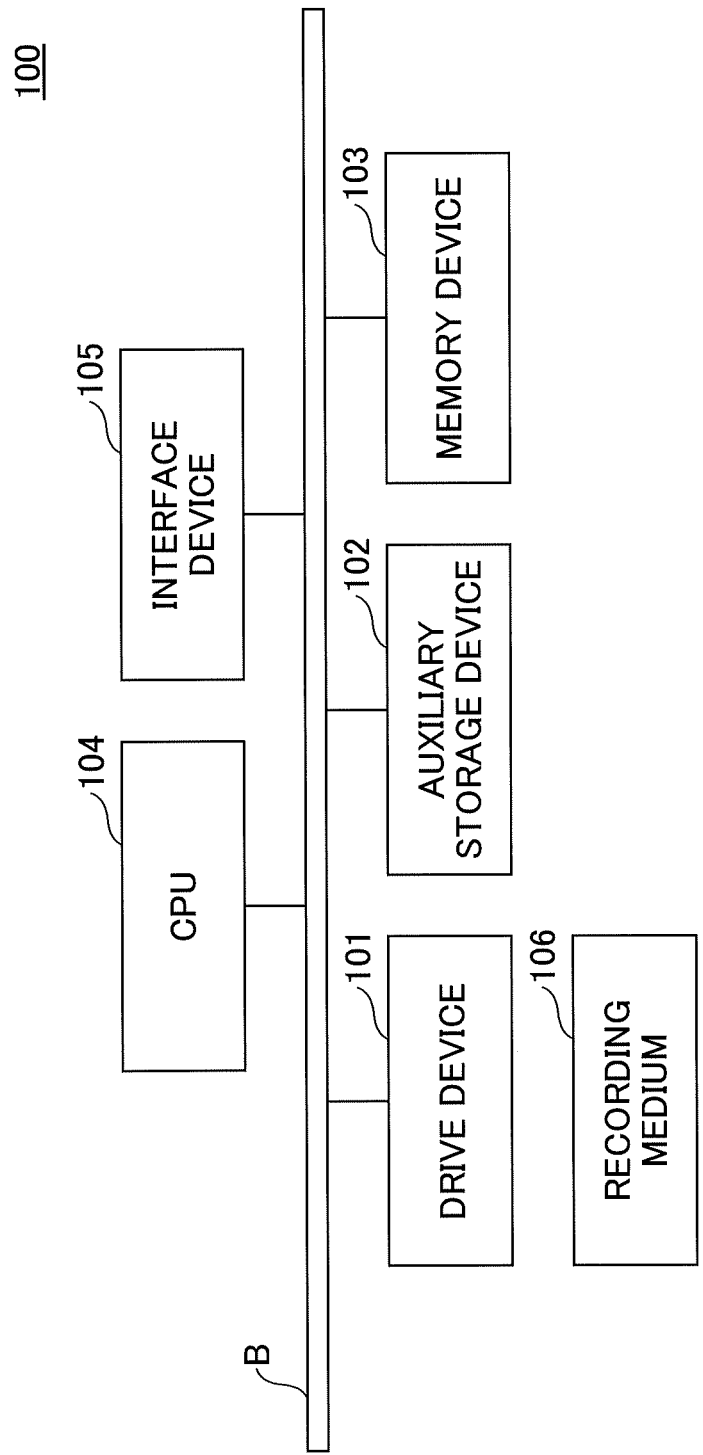
FIG. 5 is a diagram illustrating an example of a hardware configuration of a control device.

FIG. 1 is a diagram illustrating a schematic configuration of a substrate processing system according to the present embodiment. FIG. 2 is a diagram illustrating an example of a cross section of a load port. FIG. 3 is a diagram illustrating an example of a cross section of an orienter. FIG. 4 is a diagram illustrating an example of a cross section of a load-lock module. FIG. 5 is a diagram illustrating an example of a hardware configuration of a control device.

As illustrated in FIG. 1, the substrate processing system 1 includes a transfer module 10, four process modules 20, a loader module 30, two load-lock modules 40, and a control device 100.

The transfer module 10 is a substantially hexagon-shaped module in a plan view. The transfer module 10 includes a vacuum chamber, and a transfer device 11 is provided inside. The transfer device 11 includes stretchable, bendable, movable vertically, and rotatable multi-joint arms, which are accessible to the process modules 20 and the load-lock modules 40. Because the transfer device 11 includes two picks 12 which can be moved independently to opposite directions, the transfer device 11 can transfer two wafers W at a time. Note that a structure of the transfer device 11 is not limited to that in FIG. 1, as long as the transfer device 11 is configured to be capable of transferring a wafer W between the process modules 20 and the load-lock modules 40.

The process modules 20 are arranged around the transfer module 10 radially, and are connected to the transfer module 10. Each of the process modules 20 includes a processing chamber. Inside the processing chamber, a cylindrical stage 21 for placing a wafer is provided. In the process modules 20, a predetermined process such as depositing is applied to a wafer W placed on the stage 21. Each of the process modules 20 is separated from the transfer module 10 with a gate valve 22 capable of opening and closing.

The loader module 30 is arranged so as to face the transfer module 10. The loader module 30 is a cuboid shaped module, and is disposed in an atmospheric environment. A transfer device 31 is provided in the loader module 30. The transfer device 31 is supported by a guide rail 32 provided in a central portion of the loader module 30 and extending in a longitudinal direction. In the guide rail 32, for example, a linear motor having an encoder is embedded. The transfer device 31 is moved along the guide rail 32 by actuating the linear motor.

The transfer device 31 includes two multi-joint arms 33 arranged in two vertical stages. At a tip of each of the multi-joint arms 33, a bifurcated pick 34, which is a substrate holding unit, is attached. Each pick 34 is configured to hold a wafer W. Each of the multi-joint arms 33 can stretch and bend in a radial direction, and can move up and down. Stretching operation and bending operation of the multi-joint arms 33 can be controlled independently for each of the multi-joint arms 33. As rotation axes of the respective multi-joint arms 33 are rotatably connected to a base 35 coaxially, each of the multi-joint arms 33 can rotate around the base 35 as a single unit. The guide rail 32 and the multi-joint arms 33 serve as an actuation mechanism for moving the picks 34. The transfer device 31 transfers a wafer W between the process modules 20, the load-lock modules 40, a transport container 51, and an orienter 60. Details of the load-lock modules 40, the transport container 51, and the orienter 60 will be described below. Note that a configuration of the transfer device 31 is not limited to the configuration described in FIG. 1, as long as the transfer device 31 is configured to transfer a wafer W between the process modules 20, the load-lock modules 40, the transport container 51, and the orienter 60.

The two load-lock modules 40 are connected to one of side surfaces along the longitudinal direction of the loader module 30. On one of the other side surfaces along the longitudinal direction of the loader module 30, one or more loading ports 36 are provided. In the example illustrated in FIG. 1, the three loading ports 36 are provided. An opening/closing door 37 which is openable and closable is disposed at each of the loading ports 36. Also, a load port 50 is provided to each of the loading ports 36. In the load port 50, the transport container 51 used for accommodating and transporting a wafer W is disposed. The transport container 51 may be an FOUP (Front-Opening Unified Pod) for accommodating multiple (25 for example) wafers W in multiple stages at predetermined intervals. FIG. 2 illustrates one of the three load ports 50. Each of the load ports 50 is equipped with an actuator 38 for the opening/closing door 37. The opening/closing door 37 is configured to be moved up and down and to be moved forward and backward so as to open and close an opening/closing cover 52 of the transport container 51.

The orienter 60 is connected to one of side surfaces along a lateral direction (orthogonal direction to the longitudinal direction) of the loader module 30. The orienter 60 performs position alignment of a wafer W. As illustrated in FIG. 3, the orienter 60 includes a rotatable stage 62 rotated by an actuation motor 61, and the rotatable stage 62 is rotatable while a wafer W is placed on the rotatable stage 62. A diameter of the rotatable stage 62 is smaller than that of a wafer. At an outer circumference of the rotatable stage 62, an optical sensor 63 for detecting a circumference of a wafer W is provided. By using the optical sensor 63, the orienter 60 detects a center of a wafer W and an orientation of a notch with respect to the center of the wafer W, and adjusts a transferring position of the wafer W so that the center of the wafer W and the orientation of the wafer W will be respectively at a predetermined position and a predetermined orientation in the load-lock module 40.

The load-lock module 40 is disposed between the transfer module 10 and the loader module 30. The load-lock module 40 includes a chamber configured to be able to change an internal pressure between a vacuum pressure and an atmospheric pressure, and a cylindrical stage 41 used for placing a wafer W is provided inside the chamber. A diameter of the stage 41 is smaller than that of a wafer. When a wafer W is transferred from the loader module 30 to the transfer module 10, the load-lock module 40 receives the wafer W from the loader module 30 while maintaining an internal pressure in the chamber to an atmospheric pressure, and after the internal pressure is reduced, the load-lock module 40 loads the wafer W to the transfer module 10. Conversely, when a wafer W is transferred from the transfer module 10 to the loader module 30, the load-lock module 40 receives the wafer W from the transfer module 10 while maintaining the internal pressure to a vacuum pressure, and after the internal pressure is raised to an atmospheric pressure, the load-lock module 40 loads the wafer W to the loader module 30. The load-lock module 40 and the transfer module 10 are separated with an openable/closable gate valve 42. Further, the load-lock module 40 and the loader module 30 are separated with an openable/closable gate valve 42.

The control device 100 controls an operation of each element in the substrate processing system 1. As illustrated in FIG. 5, the control device 100 is a computer including a drive device 101, an auxiliary storage device 102, a memory device 103, a CPU 104, and an interface device 105, each of which is interconnected via a bus B. A program (computer program) for causing the control device 100 to perform processes is supplied through a recording medium 106 such as a CD-ROM. When the recording medium 106 storing the program is inserted to the drive device 101, the program is installed into the auxiliary storage device 102 via the drive device 101. Note that the program is not necessarily installed from the recording medium 106. The program may be downloaded from another computer via a network. The auxiliary storage device 102 stores necessary data such as the installed program and a recipe. The memory device 103 stores the program that is read out from the auxiliary storage device 102, when starting of the program is instructed. The CPU 104 executes functions concerning the substrate processing system 1, in accordance with the program stored in the memory device 103. The interface device 105 is used as an interface for connecting the control device 100 to a network.

[Pick]

Figure 6:
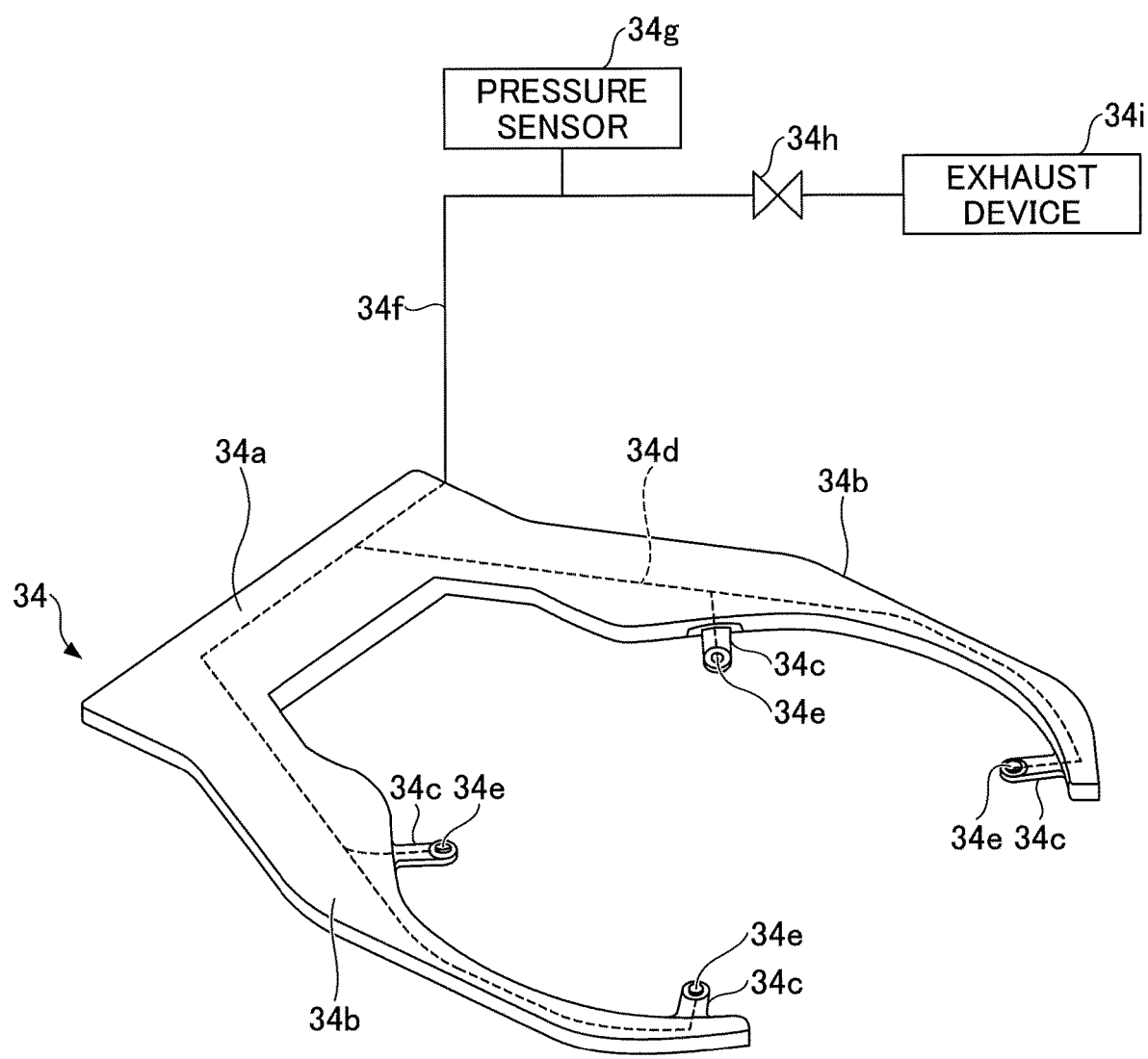
FIG. 6 is a diagram illustrating an example of a schematic structure of a pick.

Next, the pick 34 in the transfer device 31 will be described. FIG. 6 is a diagram illustrating an example of a schematic structure of the pick 34.

The pick 34 includes a base portion 34a, two tines 34b, four nails 34c, and an exhaust path 34d. The base portion 34a is attached to the multi-joint arm 33. Each of the tines 34*b* is of an arc-like shape, and extends from the base portion 34*a* toward a traveling direction of the pick 34. Each of the nails 34*c* projects from one of the tines 34*b* toward a center of a region (hereinafter referred to as a "wafer holding region") surrounded by the base portion 34*a* and the tines 34*b*. The four nails 34*c* are arranged along the wafer holding region at intervals. On an upper part of each of the nails 34*c*, a suction port 34*e* is formed. When a wafer W is placed such that a circumference of a lower surface of a wafer W covers the suction ports 34*e*, the wafer W is held on the pick 34 by suction being applied by the suction ports 34*e*. The exhaust path 34*d* is formed in the base portion 34*a* and the tines 34*b*. Both ends of the exhaust path 34*d* are connected to the suction ports 34*e*, and an exhaust pipe 34*f* is connected to the middle section of the exhaust path 34*d*. A set of the exhaust path 34*d* and the exhaust pipe 34*f* configures a type of suction path.

A pressure sensor 34*g* which is a pressure detecting unit and a valve 34*h* are disposed on the exhaust pipe 34*f*. The pressure sensor 34*g* detects a pressure in the exhaust pipe 34*f* (hereinafter referred to as a "suction pressure"), and outputs a signal corresponding to the detected pressure to the control device 100. An exhaust device 34*i* is connected to a downstream side of the valve 34*h* of the exhaust pipe 34*f*. The exhaust device 34*i* includes a regulator, a vacuum pump, and the like, and applies suction from the exhaust path 34*d* and the exhaust pipe 34*f* while controlling pressure. The valve 34*h* is controlled to be opened while teaching of the transfer device 31 (to be described below) is being performed. The valve 34*h* is also controlled to be opened during a period from a time just before the transfer device 31 receives a wafer W from one module to a time just after the transfer device 31 places the wafer W to another module. During the other periods, the valve 34*h* is controlled to be closed. By opening the valve 34*h*, suction from the suction ports 34*e* is performed, during a period of the teaching of the transfer device 31, and during a period from a time just before the transfer device 31 starts to hold a wafer W to a time just after the transfer device 31 releases the wafer W.

[Teaching Method]

Figure 7:
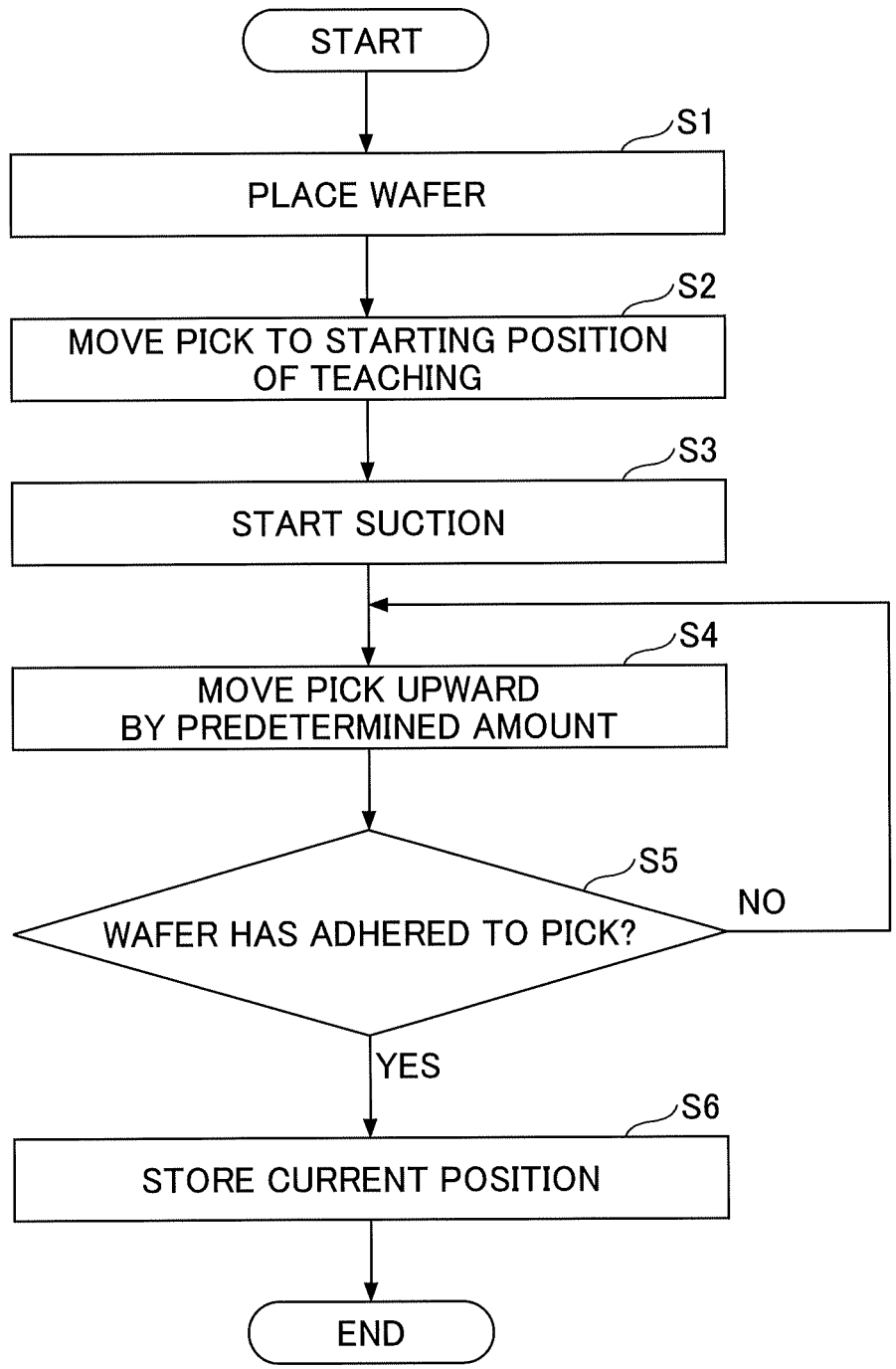
FIG. 7 is a flowchart illustrating a process flow of a teaching method for the transfer device according to the present embodiment.

Next, a method of the teaching for the transfer device 31 according to the present embodiment will be described. FIG. 7 is a flowchart illustrating a process flow of the method (teaching method) of the teaching for the transfer device 31 according to the present embodiment.

In the following, a method of teaching the substrate processing system 1 a position at which an upper surface of the pick 34 of the transfer device 31 contacts a lower surface of a wafer W placed on the rotatable stage 62 in the orienter 60 will be described as an example of the teaching method. However, in the teaching, a position, at which the upper surface of the pick 34 of the transfer device 31 contacts a lower surface of a wafer W placed on the stage 41 in the load-lock module 40 or a lower surface of a wafer W stored in the transport container 51, may also be taught. Further, in the following description, operations of each component in the substrate processing system 1 are controlled by the control device 100.

At step S1, a wafer W used for the teaching is placed on the rotatable stage 62 (placing step). With respect to a wafer W used for the teaching, a wafer for a product, a wafer for testing, a monitor wafer, a wafer for transfer checking, a dummy wafer, and the like, can be used as a wafer W for the teaching.

At step S2, the pick 34 of the transfer device 31 is moved to a starting position of teaching, which is below the wafer W (first moving step). By performing the first moving step, the multi-joint arm 33 of the transfer device 31 is stretched.

At step S3, suction from the exhaust path 34*d* and the exhaust pipe 34*f* is started, by opening the valve 34*h* provided at the exhaust pipe 34*f*. Note that a timing of starting the suction from the exhaust path 34*d* and the exhaust pipe 34*f* is not limited to step S3. For example, the suction may be started before the pick 34 is moved to the starting position of teaching, or while the pick 34 is being moved toward the starting position of teaching.

At step S4, the pick 34 is controlled to be moved upward by a predetermined distance (such as 0.1 mm) and stopped (second moving step). By performing the second moving step, a distance between the upper surface of the pick 34 and a lower surface of the wafer W becomes smaller.

At step S5, the control device 100 determines whether the wafer W has adhered to the pick 34 (determination step). For example, based on whether or not a suction pressure detected by the pressure sensor 34*g* has reached a predetermined threshold or less within a certain period of time, the control device 100 determines whether the wafer W has adhered to the pick 34. Specifically, in a case in which the suction pressure has reached the predetermined threshold or less within the certain period of time, the control device 100 determines that the wafer W has adhered to the pick 34. Conversely, in a case in which the suction pressure has not reached the predetermined threshold or less within the certain period of time, the control device 100 determines that the wafer W has not adhered to the pick 34. The certain period of time may be set to a time required until a suction pressure detected by the pressure sensor 34*g* becomes substantially constant. Alternatively, for example, based on an amount of difference of a suction pressure between a suction pressure when the pick 34 is positioned at the starting position of teaching and a suction pressure when the pick 34 is moved upward by the predetermined distance, the control device 100 determines whether the wafer W has adhered to the pick 34. For example, in a case in which the difference of the suction pressure is not less than a given threshold, the control device 100 determines that the wafer W has adhered to the pick 34. Conversely, in a case in which the difference of the suction pressure is less than the given threshold, the control device 100 determines that the wafer W has not adhered to the pick 34. Further, if the transfer device 31 is equipped with a controller capable of determining whether or not the wafer W has adhered to the pick 34, the control device 100 may determine whether or not the wafer W has adhered to the pick 34 based on a result of determination by the controller. For example, when the controller has determined that the wafer W has adhered to the pick 34, the control device 100 determines that the wafer W has adhered to the pick 34 in response to receiving the result of determination by the controller. Conversely, when the controller has determined that the wafer W has not adhered to the pick 34, the control device 100 determines that the wafer W has not adhered to the pick 34 in response to receiving the result of determination by the controller.

If, at step S5, it is determined that the wafer W has not adhered to the pick 34, the control device 100 determines that the lower surface of the wafer W has not touched the upper surface of the pick 34, and the process reverts to step S4. That is, the control device 100 intermittently moves the pick 34 upward until the pick 34 adheres to the wafer W. Conversely, at step S5, if it is determined that the wafer W has adhered to the pick 34, the control device 100 determines that the lower surface of the wafer W has touched the upper surface of the pick 34, and the process proceeds to step S6.

At step S6, the control device 100 stores a position of the pick 34 when it is determined that the wafer W has adhered to the pick 34 (hereinafter, the position of the pick 34 when it is determined that the wafer W has adhered to the pick 34 may be referred to as a "current position") into the auxiliary storage device 102 or the like, as a standard position, and the process terminates.

By the above described steps S1 to S6 being performed, teaching of a position at which the pick 34 contacts a wafer W can be accomplished.

As described above, in the teaching method of the transfer device 31 according to the present embodiment, a position at which the pick 34 contacts a wafer W is taught based on the suction pressure when the pick 34 for holding the wafer W by suction is moved upward from the underneath of the wafer. In this method, as an operator does not need to detect the position visually, dispersion of accuracy of teaching in a vertical direction depending on operator's skill can be reduced. Further, man-hours required for teaching for the transfer device 31 can be reduced. Also, because the teaching method eliminates a necessity of a dedicated jig for teaching, and the teaching method makes technical education for operators easy, cost required for teaching can be reduced.

Further, in the teaching method according to the present embodiment, a vertical position at which the upper surface of the pick 34 touches the lower surface of the wafer W is detected while the multi-joint arm 33 is stretched. Accordingly, the method can suppress degradation of accuracy of teaching because of bending of the multi-joint arm 33 that may be caused by weight of the pick 34 when the multi-joint arm 33 is stretched.

Figure 8:
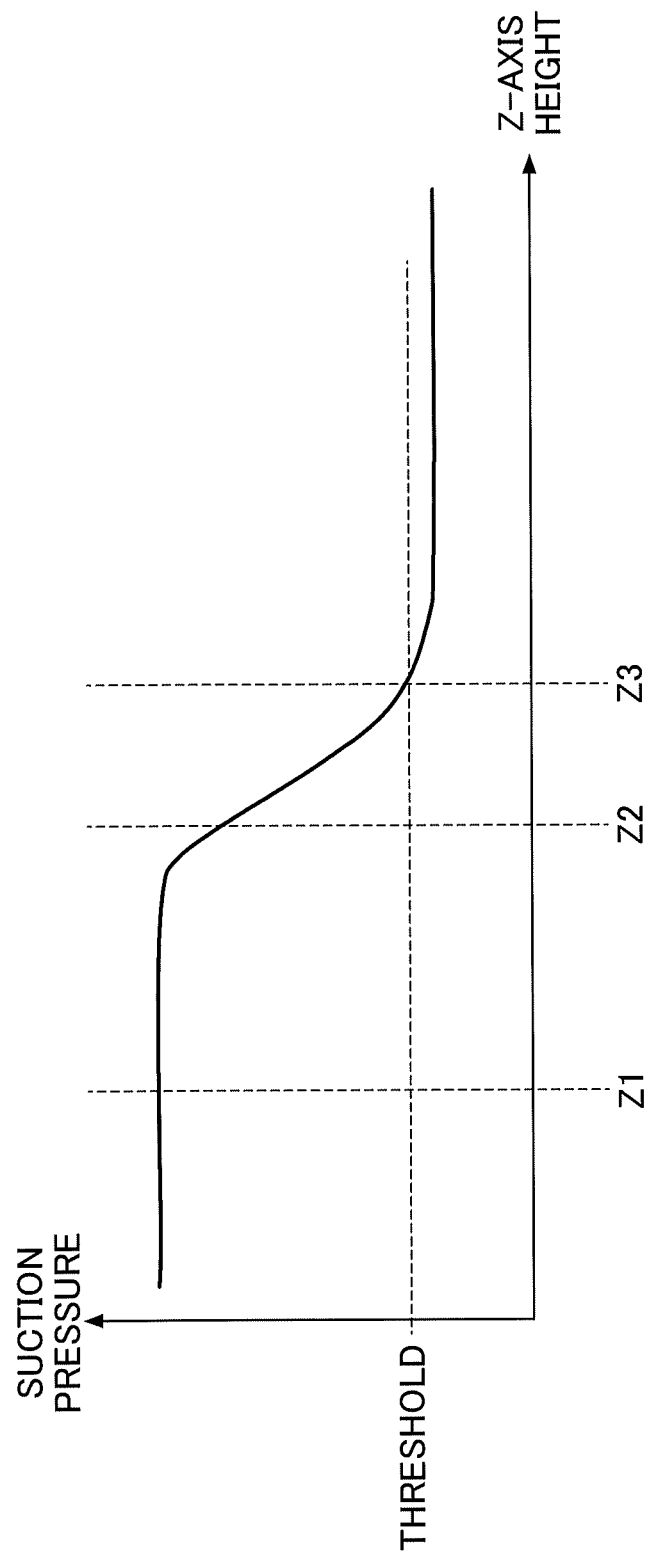
FIG. 8 is a diagram illustrating a relationship between a height of the pick and a suction pressure.
Figure 9A:
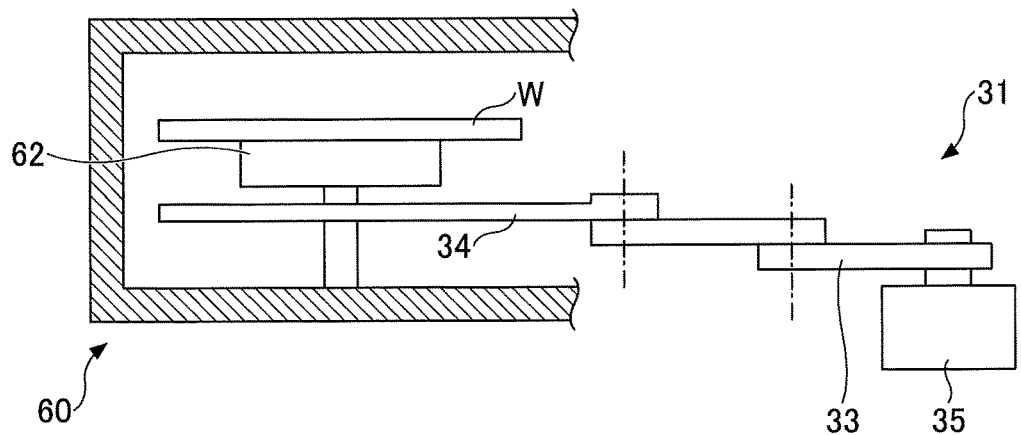
FIGS. 9A to 9C are diagrams each illustrating a positional relationship between the pick and a wafer.
Figure 9B:
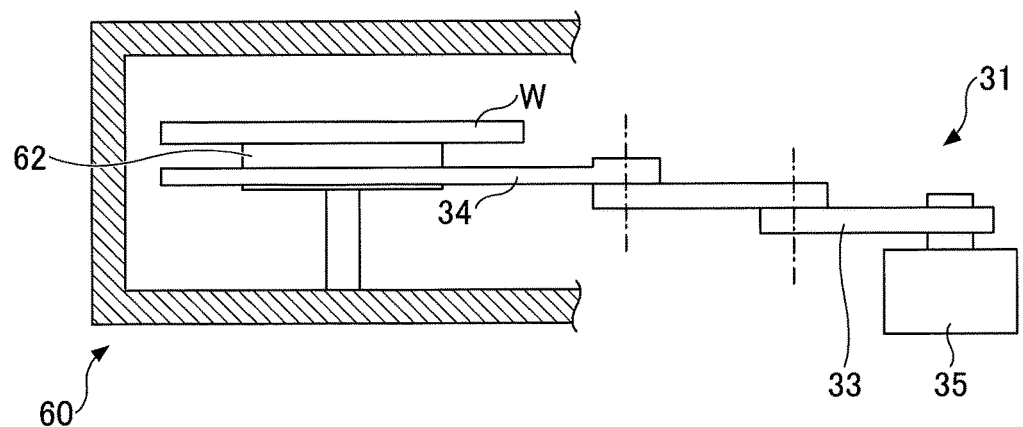
Figure 9C:
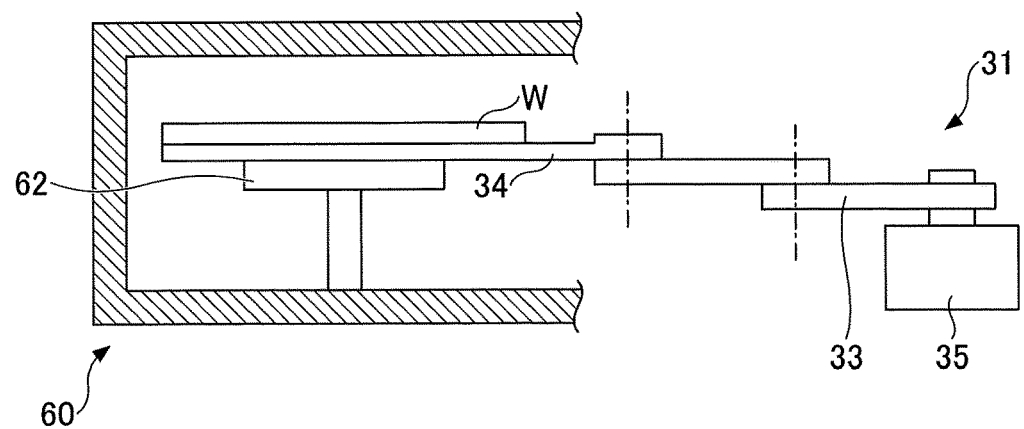

Next, a relationship between a height of the pick 34 and a suction pressure, when the above described teaching method for the transfer device 31 is employed, is described. FIG. 8 is a diagram illustrating a relationship between a height of the pick 34 and a suction pressure. A vertical axis represents a suction pressure detected by the pressure sensor 34g, and a horizontal axis represents a position of the pick 34 in a height direction (hereinafter referred to as a "Z-axis height"). FIGS. 9A to 9C are diagrams each illustrating a positional relationship between the pick 34 and a wafer W. FIG. 9A, FIG. 9B, and FIG. 9C represent positional relationships between the pick 34 and a wafer W when the Z-axis height (in FIG. 8) is Z1, Z2, and Z3 respectively.

When the pick 34 is apart from the wafer W (such as a state illustrated in FIG. 9A), the suction ports 34e on the pick 34 are open. Thus, as illustrated in FIG. 8, the suction pressure is high.

When the pick 34 is close to the wafer W (such as a state illustrated in FIG. 9B), the suction pressure becomes lower as the upper surface of the pick 34 is getting closer to the lower surface of the wafer W, as illustrated in FIG. 8.

When the upper surface of the pick 34 is in contact with the lower surface of the wafer W (such as a state illustrated in FIG. 9C), the suction ports 34e on the pick 34 is closed off. Thus, the suction pressure becomes much lower, as illustrated in FIG. 8.

As described above, the suction pressure detected by the pressure sensor 34g varies before and after the upper surface of the pick 34 contacts with the lower surface of the wafer W.

In the present embodiment, a threshold is set to a value higher than a suction pressure when the upper surface of the pick 34 is in contact with a lower surface of a wafer W and lower than a suction pressure when the upper surface of the pick 34 is apart from a lower surface of a wafer W, as illustrated in FIG. 8. In a case in which a suction pressure detected by the pressure sensor 34g is not higher than the threshold, the control device 100 determines that the upper surface of the pick 34 has contacted a lower surface of a wafer W, and stores the current position into the auxiliary storage device 102 or the like, as the standard position.

[Transfer Method of Wafer]

Figure 10A:
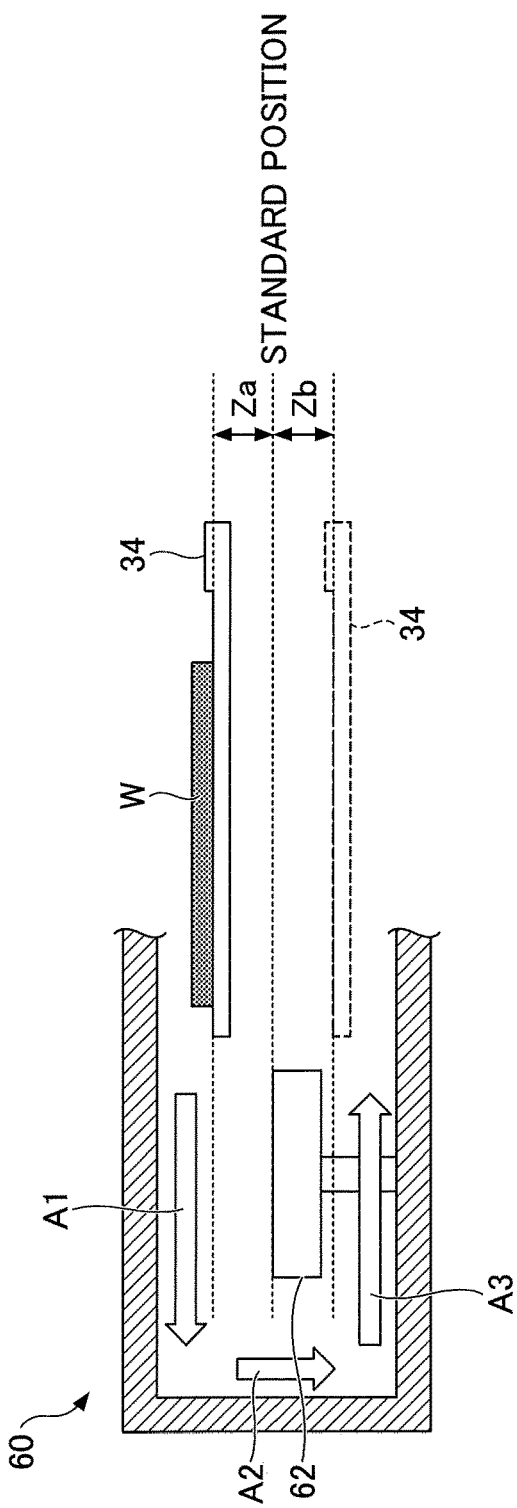
FIGS. 10A and 10B are diagrams illustrating operations for passing a wafer between the pick and a rotatable stage.
Figure 10B:
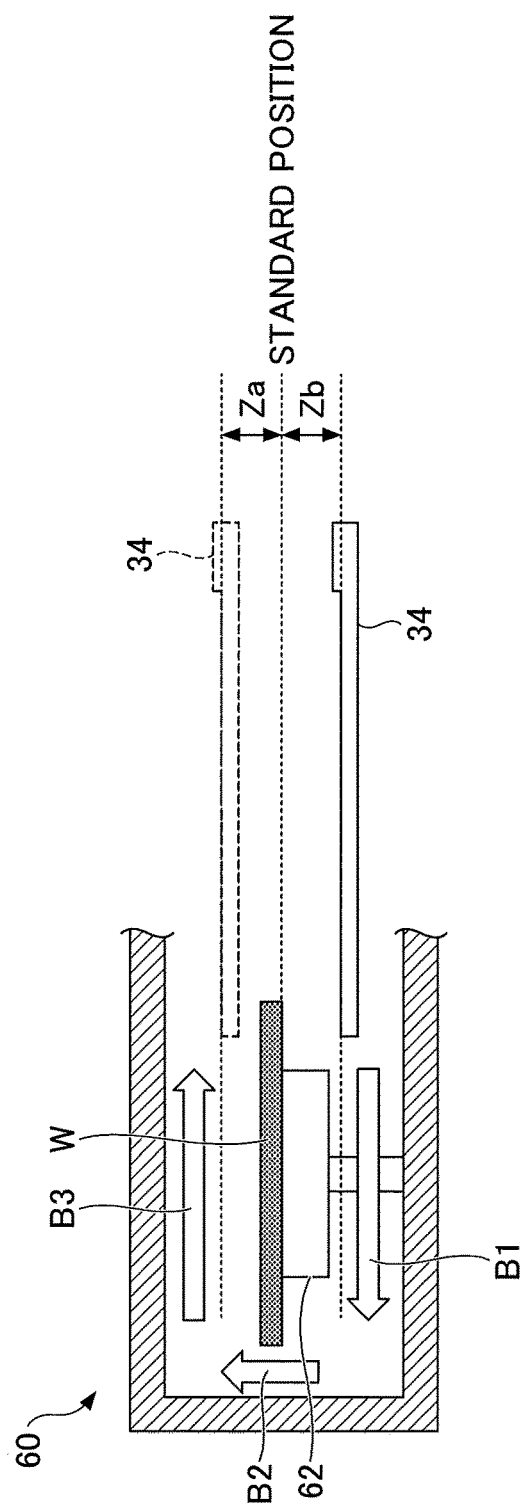

Next, a method of transferring a wafer W will be described, by referring to a case in which a wafer W is loaded into the orienter 60 by the transfer device 31 to which teaching has been made by using the above described teaching method, a transferring position of the wafer W is adjusted, and the wafer W is unloaded from the orienter 60. FIGS. 10A and 10B are diagrams illustrating operations for passing a wafer W between the pick 34 and the rotatable stage 62. FIG. 10A represents an operation performed when the pick 34 holding a wafer W places the wafer W on the rotatable stage 62. FIG. 10B represents an operation performed when the wafer W on the rotatable stage 62 is about to be held by the pick 34.

First, the transport container 51 accommodating a wafer W is placed on the load port 50. Next, the pick 34 of the transfer device 31 is caused to enter the transport container 51, lift and hold the wafer W, and withdraw from the transport container 51.

Subsequently, as indicated by an arrow A1 in FIG. 10A, the pick 34 holding the wafer W is caused to enter an area above the rotatable stage 62 in the orienter 60 from a level of a first height, which is higher than the standard position that has been stored by the above described teaching method, by a predetermined amount Za (such as 2 to 3 mm).

Next, as indicated by an arrow A2 in FIG. 10A, the pick 34 is caused to move down to a level of a second height, which is lower than the standard position by a predetermined amount Zb (such as 2 to 3 mm). During the operation of moving down, a lower surface of the wafer W contacts an upper surface of the rotatable stage 62 at the standard position. By the pick 34 being moved down to the second level, the wafer W is placed on the rotatable stage 62.

Next, as indicated by an arrow A3 in FIG. 10A, the pick 34 is caused to withdraw from the orienter 60. After the pick 34 withdraws from the orienter 60, adjustment of a transferring position of the wafer W to the load-lock module 40 is performed by using the orienter 60.

Next, as indicated by an arrow B1 in FIG. 10B, the pick 34 not holding the wafer W is caused to enter an area below the rotatable stage 62 in the orienter 60 from a level of a second height, which is lower than the standard position, by the predetermined amount Zb (such as 2 to 3 mm).

Next, as indicated by an arrow B2 in FIG. 10B, the pick 34 is caused to lift to a level of a first height, which is higher than the standard position by the predetermined amount Za. During the lifting operation, a lower surface of the wafer W contacts an upper surface of the pick 34 at the standard position. By the pick 34 being lifted to the first level, the wafer W is held by the pick 34.

Next, as indicated by an arrow B3 in FIG. 10B, the pick 34 holding the wafer W is caused to withdraw from the orienter 60.

By the above described operations being performed, a wafer W can be loaded into the orienter 60 by the transfer device 31, a transferring position of the wafer W can be adjusted, and the wafer W can be unloaded from the orienter 60.

Although the embodiments of the present invention have been described above, the present invention is not limited to the embodiments described above. Various changes or enhancements can be made hereto within the scope of the present invention.

In the above embodiments, a case in which a substrate is a semiconductor wafer has been described as an example, but the present invention is not limited to this case. For example, the substrate may be a glass substrate, an LCD substrate, or the like.

What is claimed is:

1. A teaching method of a transfer device including a substrate holding unit including a suction port for holding a substrate by applying suction, an actuation mechanism configured to move the substrate holding unit, and a pressure detecting unit configured to detect a pressure in a suction path communicating with the suction port, the method comprising:
   a first moving step of moving the substrate holding unit under the substrate;
   a second moving step of moving the substrate holding unit upward toward the substrate, while applying suction to the suction path and detecting the pressure in the suction path;
   a determination step of determining whether or not the substrate holding unit has touched the substrate, based on the pressure in the suction path; and
   a storing step of storing, as a standard position, a position of the substrate holding unit at a time of determining that the substrate holding unit has touched the substrate.

2. The teaching method according to claim 1, wherein, in the second moving step, the substrate holding unit is intermittently moved by a predetermined amount.

3. The teaching method according to claim 2, wherein, in the determination step, whether or not the substrate holding unit has touched the substrate is determined based on the pressure in the suction path when the substrate holding unit is being stopped.

4. The teaching method according to claim 1, wherein, in the determination step, it is determined that the substrate holding unit has touched the substrate when the pressure in the suction path is not higher than a threshold.

5. The teaching method according to claim 4, wherein the threshold is higher than the pressure in the suction path when an upper surface of the substrate holding unit is in contact with a lower surface of the substrate, and the threshold is lower than the pressure in the suction path when the upper surface of the substrate holding unit is apart from the lower surface of the substrate.

6. The teaching method according to claim 3, wherein, in the determination step, it is determined that the substrate holding unit has touched the substrate when an amount of difference of the pressure in the suction path is not less than a threshold.

7. The teaching method according to claim 1, wherein the actuation mechanism includes a multi-joint arm.

8. The teaching method according to claim 7, wherein the second moving step is performed while the multi-joint arm is being stretched.

9. The teaching method according to claim 1, the method being applied to a substrate processing system including a process chamber configured to apply a predetermined process to the substrate, an orienter configured to perform position alignment of the substrate, a transport container configured to accommodate a plurality of substrates, a load-lock module configured to be able to change an internal pressure between a vacuum pressure and an atmospheric pressure, a loader module including the transfer device, the loader module being connected to the transport container, the orienter, and the load-lock module, and being configured to transfer the substrate among the transport container, the orienter, and the load-lock module, by using the transfer device, and a transfer module including another transfer device, the transfer module being connected to the process chamber and the load-lock module, and being configured to transfer the substrate loaded in the load-lock module by the loader module to the process chamber; wherein the method is performed in order to determine a vertical position of the substrate holding unit with respect to the substrate placed on a stage in the orienter, on a stage in the load-lock module, or in the transport container.

10. A teaching method of a transfer device including a substrate holding unit including a suction port for holding a substrate by applying suction, an actuation mechanism including a multi-joint arm configured to move the substrate holding unit, and a pressure detecting unit configured to detect a pressure in a suction path communicating with the suction port, the method comprising:
   a first moving step of moving the substrate holding unit under the substrate;
   a second moving step of intermittently moving the substrate holding unit upward toward the substrate by a predetermined amount, in a state in which the multi-joint arm is being stretched, the second moving step being performed while applying suction to the suction path and detecting the pressure in the suction path;
   a determination step of determining whether or not the substrate holding unit has touched the substrate, based on the pressure in the suction path when the substrate holding unit is being stopped; and
   a storing step of storing, as a standard position, a position of the substrate holding unit at a time of determining that the substrate holding unit has touched the substrate.

11. The teaching method according to claim 10, wherein, in the determination step, it is determined that the substrate holding unit has touched the substrate when the pressure in the suction path is not higher than a threshold.

12. The teaching method according to claim 10, wherein, in the determination step, it is determined that the substrate holding unit has touched the substrate when an amount of difference of the pressure in the suction path is not less than a threshold.

* * * * *